US009520281B2

United States Patent
Liu

(10) Patent No.: US 9,520,281 B2
(45) Date of Patent: Dec. 13, 2016

(54) METHOD OF FABRICATING AN OPTOELECTRONIC DEVICE WITH A HOLLOW COMPONENT IN EPITAXIAL LAYER

(71) Applicant: Epistar Corporation, Hsinchu (TW)

(72) Inventor: Ai-Sen Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 79 days.

(21) Appl. No.: 14/204,728

(22) Filed: Mar. 11, 2014

(65) Prior Publication Data
US 2014/0264390 A1    Sep. 18, 2014

Related U.S. Application Data

(60) Provisional application No. 61/802,869, filed on Mar. 18, 2013.

(51) Int. Cl.
| | |
|---|---|
| *H01L 21/02* | (2006.01) |
| *H01L 33/42* | (2010.01) |
| *H01L 33/60* | (2010.01) |
| *H01L 33/00* | (2010.01) |
| *H01L 33/16* | (2010.01) |

(52) U.S. Cl.
CPC ..... *H01L 21/02203* (2013.01); *H01L 21/0254* (2013.01); *H01L 21/02458* (2013.01); *H01L 21/02461* (2013.01); *H01L 21/02513* (2013.01); *H01L 21/02656* (2013.01); *H01L 21/02543* (2013.01); *H01L 33/0079* (2013.01); *H01L 33/16* (2013.01); *H01L 33/42* (2013.01); *H01L 33/60* (2013.01)

(58) Field of Classification Search
CPC ............ H01L 33/60; H01L 33/0079; H01L 21/02203; H01L 21/02458; H01L 33/16; H01L 33/42
See application file for complete search history.

(56) References Cited

U.S. PATENT DOCUMENTS

| | | | | |
|---|---|---|---|---|
| 8,546,819 | B2* | 10/2013 | Yoon | H01L 33/0079 257/82 |
| 8,860,059 | B2* | 10/2014 | Chen | H01L 33/62 257/98 |
| 2006/0166468 | A1* | 7/2006 | Yonehara | C30B 25/02 438/483 |
| 2012/0187444 | A1* | 7/2012 | Oh | H01L 21/0237 257/99 |
| 2012/0187445 | A1* | 7/2012 | Oh | H01L 21/0237 257/99 |
| 2012/0326192 | A1* | 12/2012 | Van Slyke | H01L 51/0013 257/98 |
| 2013/0026525 | A1* | 1/2013 | Chen | H01L 33/62 257/98 |

(Continued)

*Primary Examiner* — Alonzo Chambliss
(74) *Attorney, Agent, or Firm* — Ditthavong & Steiner, P.C.

(57) ABSTRACT

A method of fabricating an epitaxial device, comprising: providing a substrate having a first surface and a normal direction; epitaxially forming a first transition layer in a first temperature on the first surface of the substrate and in-situ incorporating a porogen into the first transition layer; and adjusting the first temperature to a second temperature to burn out the porogen from the first transition layer to form a hollow component inside the first transition layer.

14 Claims, 9 Drawing Sheets

(56) References Cited

U.S. PATENT DOCUMENTS

2013/0193416 A1\* 8/2013 Shin ..................... H01L 51/50
  257/40
2015/0008468 A1\* 1/2015 Chen ..................... H01L 33/62
  257/98

\* cited by examiner

METHOD OF FABRICATING AN OPTOELECTRONIC DEVICE WITH A HOLLOW COMPONENT IN EPITAXIAL LAYER

BACKGROUND

1. Technical Field

The present disclosure relates to an optoelectronic device having a first transition layer with a hollow component formed between the epitaxial stack and the substrate. In addition, the disclosure also disclosed a method of fabricating the optoelectronic device.

2. Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as a new light source for the illumination markets. The LED applies to various applications like the traffic signal, backlight module, street light, and medical instruments, and is gradually replacing the traditional lighting sources.

FIG. 1 illustrates the structure of a conventional light emitting device 100 which includes a transparent substrate 10, a semiconductor stack layer 12 formed above the transparent substrate 10, and an electrode 14 formed above the semiconductor stack layer 12, wherein the semiconductor stack layer 12 comprises a first conductive-type semiconductor layer 120, an active layer 122, and a second conductive-type semiconductor layer 124.

In addition, the light emitting device 100 can be further connected to other components in order to form a light emitting apparatus. FIG. 2 illustrates a conventional light emitting apparatus 200 including a sub-mount 20 carrying an electrical circuit 202, a solder 22 formed above the sub-mount 20; wherein the light emitting device 100 is bonded to the sub-mount 20 and is electrically connected with the electric circuit 202 on the sub-mount 20 by the solder 22, and an electrical connection structure 24 that electrically connects the electrode 14 of the light emitting device 100 to the electric circuit 202 on the sub-mount 20. The sub-mount 20 may be a lead frame or a large size mounting substrate in order to facilitate circuit design and enhance heat dissipation.

Nevertheless, because the surface of the transparent substrate 10 of the conventional light emitting device 100 as shown in FIG. 1 is substantially flat and the refractive index of the transparent substrate 10 is different from the refractive index of the external environment, the total internal reflection (TIR) occurs when a light A emitted from the active layer 122. Therefore the light extraction efficiency from the light emitting device 100 is reduced drastically.

SUMMARY OF THE DISCLOSURE

A method of fabricating an epitaxial device, comprising: providing a substrate having a first surface and a normal direction; epitaxially forming a first transition layer in a first temperature on the first surface of the substrate and in-situ incorporating a porogen into the first transition layer; and adjusting the first temperature to a second temperature to burn out the porogen from the first transition layer to form a hollow component inside the first transition layer.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1:
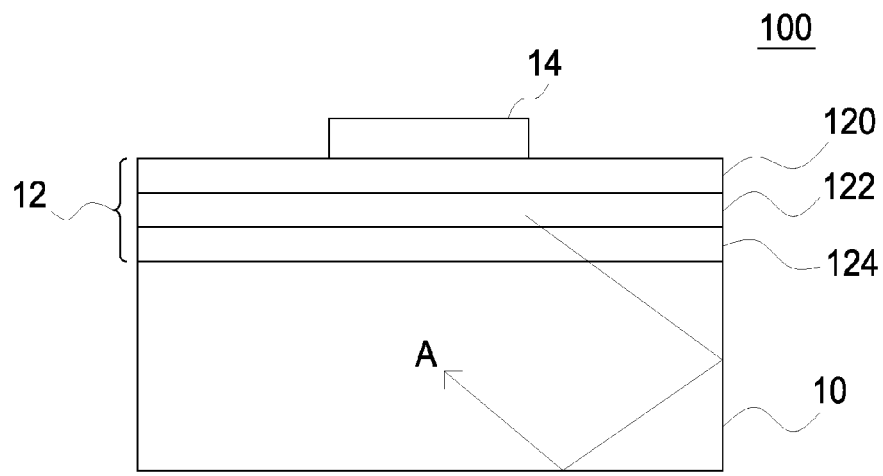
FIG. 1 illustrates the structure of a conventional light emitting device.
Figure 2:
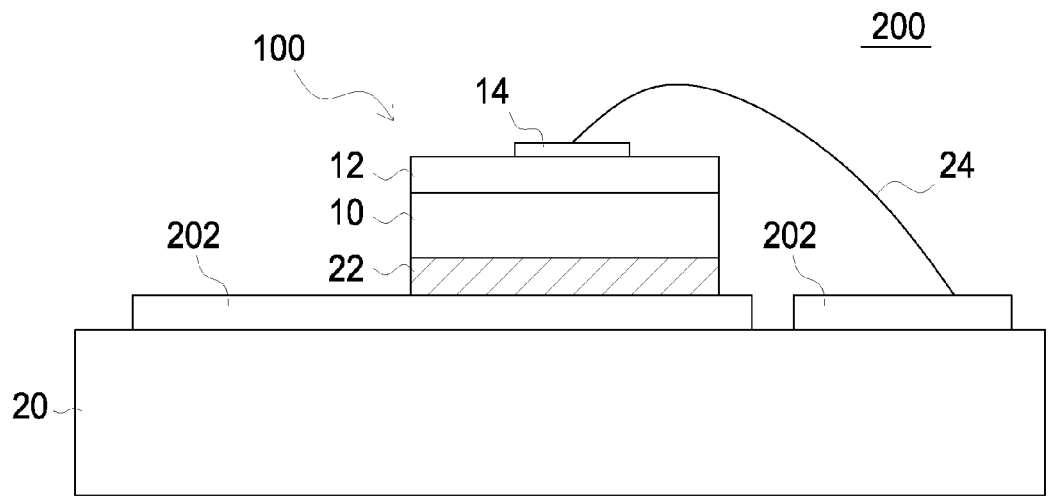
FIG. 2 illustrates the structure of a conventional light emitting apparatus.

Reference is made in detail to the preferred embodiments of the present application, examples of which are illustrated in the accompanying drawings. Wherever possible, the same reference numbers are used in the drawings and the description to refer to the same or like parts.

The present disclosure describes an optoelectronic device and a method of fabricating the optoelectronic device. In order to have a thorough understanding of the present disclosure, please refer to the following description and the illustrations of FIG. 3A to FIG. 7.

Figure 3A:
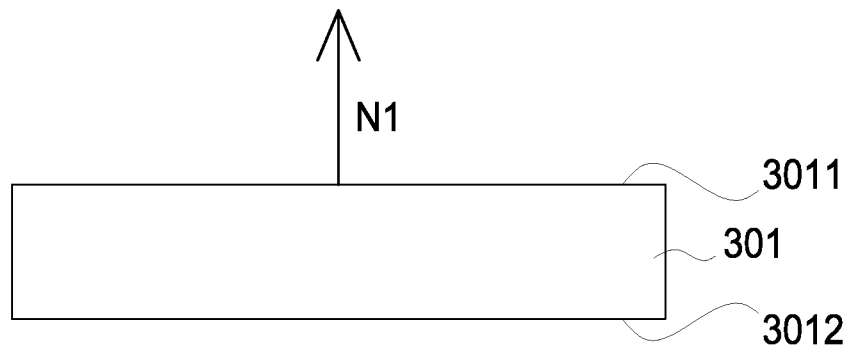
FIGS. 3A to 3F illustrate a process flow of a method of fabricating an optoelectronic device of the embodiment of the present disclosure.

FIGS. 3A to 3F illustrate a process flow of the method of fabricating the optoelectronic device of a first embodiment of the present disclosure. FIG. 3A illustrates a substrate 301 having a first surface 3011 and a second surface 3012 opposite to the first surface 3011 and a normal direction N1 vertical to the first surface 3011.

Figure 3B:
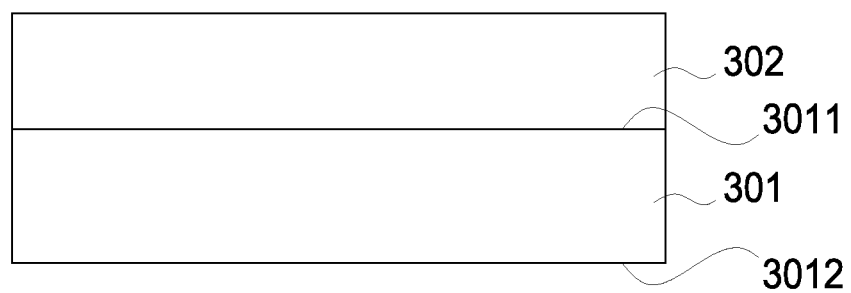

Following, as FIG. 3B illustrates, an inter layer 302 can be optionally formed on the first surface of the substrate 3011. The inter layer 302 can be an unintentional doped layer or an undoped layer. The inter layer 302 can be non-single crystalline or single crystalline layer.

Figure 3C:
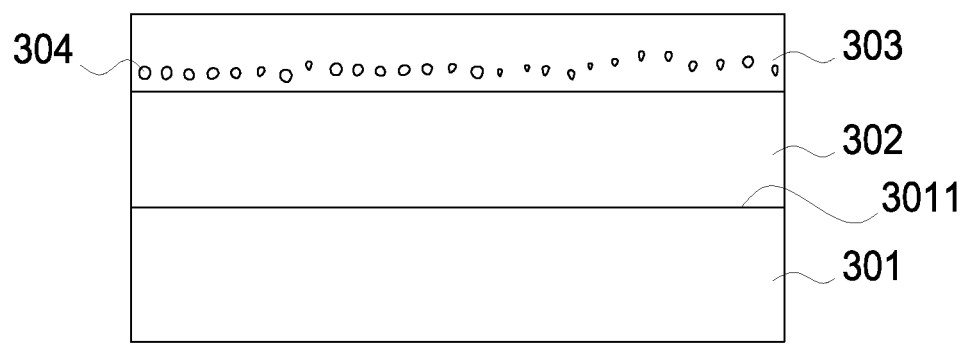

Following, as FIG. 3C illustrates, a first transition layer 303 is epitaxially formed on the first surface 3011 of the substrate 301 and incorporating a porogen 304 in-situ into the first transition layer 303 in a first temperature.

In this embodiment, the material of the first transition layer 303 contains at least one element selected from the group consisting of Al, Ga, In, As, P, and N, such as GaN or AlGaInP. In one embodiment, the first transition layer 303 can be an unintentional doped layer or an undoped layer and the thickness of the first transition layer 303 can be 1-3 μm, 1.5-3 μm or 2-3 μm.

Figure 3D:
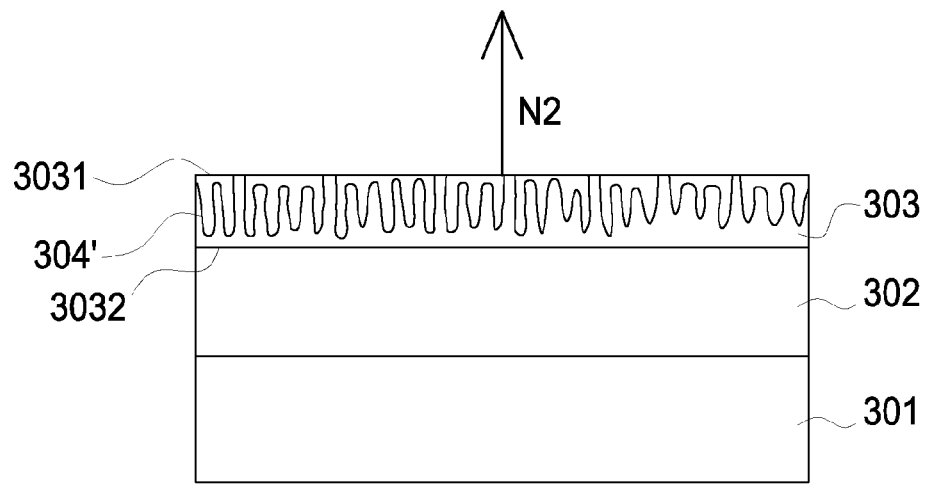

Following, as FIG. 3D illustrates, by adjusting the first temperature to a second temperature, the porogen 304 can be burned out from the first transition layer 303 to form a hollow component 304' inside the first transition layer 303.

In one embodiment, the first temperature is lower than the second temperature. In one embodiment, the second temperature is 700-900° C.

Figure 4A:
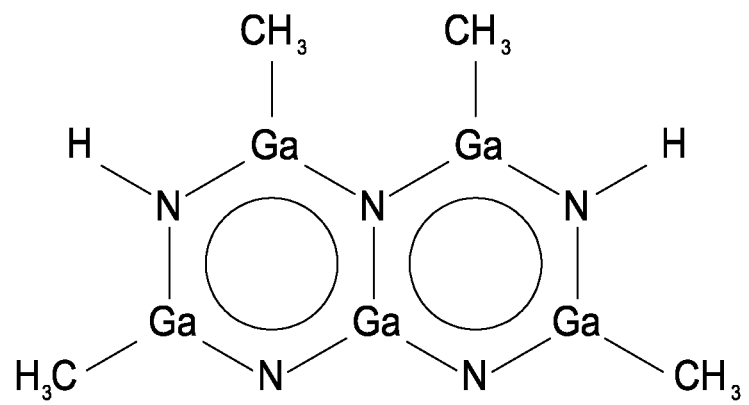
FIGS. 4A to 4B illustrate the chemical formula of the porogen in the present disclosure.
Figure 4B:
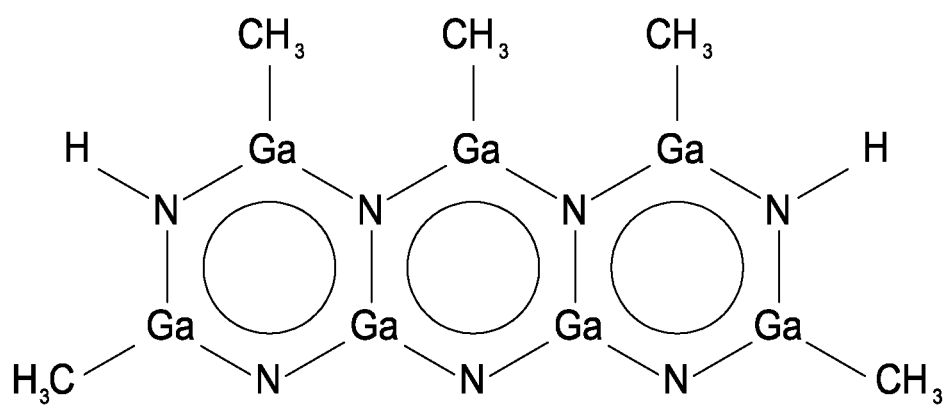

In one embodiment, the porogen 304 can be a cyclic structure. As FIGS. 4A-4B illustrate, the chemical formula of the porogen 304 in the embodiment can be Bi-Cyclic Tetramethyl Gallium Nitride or Tri-Cyclic Pentamethyl Gallium Nitride.

In one embodiment, the first transition layer 303 has a first surface 3031 and a second surface 3032 opposite to the first surface 3031 and closer to the substrate 301. The first transition layer 303 has a normal direction N2 vertical to the first surface 3031. The hollow component 304' can be a nano-scale structure and/or an elongated structure having an elongated direction parallel to the normal direction N2. In one embodiment, the hollow component inside the first transition layer 303 having an opening on the first surface of the first transition layer 3031.

In one embodiment, the hollow component 304' can be a pore, void, bore, pinhole, cavity, or at least two hollow components 304' can link into a mesh or porous structure.

The porosity Φ of the plurality of the hollow components 304' is defined as the total volume of the hollow components $V_v$ divided by the overall volume $V_T$ of the first transition layer 303

$$\left(\phi = \frac{V_V}{V_T}\right).$$

In this embodiment, the porosity Φ can be 5%-50%, 10%-50%, 20%-50%, 30%-50% or 40%-50%. The porosity and size of the hollow component 304' can be adjusted by the porogen types and the volume of porogen incorporated into the first transition layer 303. Besides, the distribution of the hollow component 304' can also be adjusted.

In one embodiment, a second transition layer (not shown) is formed on the first surface of the first transition layer 3031. At least one hollow component can be formed inside the second transition layer and the porosity of the hollow component inside the first and the second transition layer can be different.

Figure 3E:
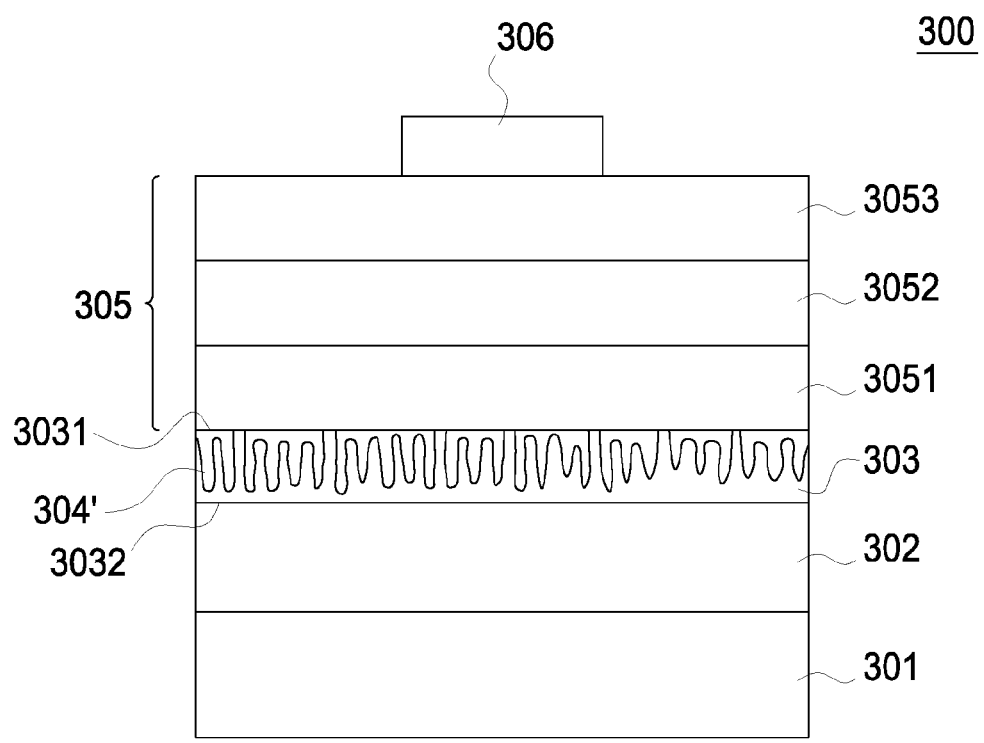

Following, as FIG. 3E illustrates, an epitaxial stack 305 can be formed on the first surface 3031 of the first transition layer. The epitaxial stack 305 can include a first conductivity semiconductor layer 3051, an active layer 3052, and a second conductivity semiconductor layer 3053 formed on the first surface of the first transition layer 3031 subsequently. And an electrode 306 can be formed on the second conductivity semiconductor layer 3053 to form an optoelectronic device 300. In one embodiment, the electrode 306 can be a single layer or a multi-layer stack. The material of the electrode 306 can be Cr, Ti, Ni, Pt, Cu, Au, Al, Ag, or its alloy.

By the process of this embodiment, the hollow component 304' can be formed during the epitaxial growth process and no additional processes are needed. Therefore, the manufacturing quality and yield can be improved.

The hollow components 304' inside the first transition layer 303 having a refractive index. When there is a difference between the refractive index of the hollow components 304 and the first transition layer 303, for example, the refractive index of the first transition layer 303 is 2-3, and the refractive index of air is 1, the light transmitting into the hollow components 304' changes its emitting direction to outside the optoelectronic device 300 and increases the light emitting efficiency. Besides, the hollow components 304' can be a scattering center to change the direction of the photon and decrease the total reflection. By increasing the porosity of the hollow component 304', the effect mentioned above is increased.

Figure 3F:
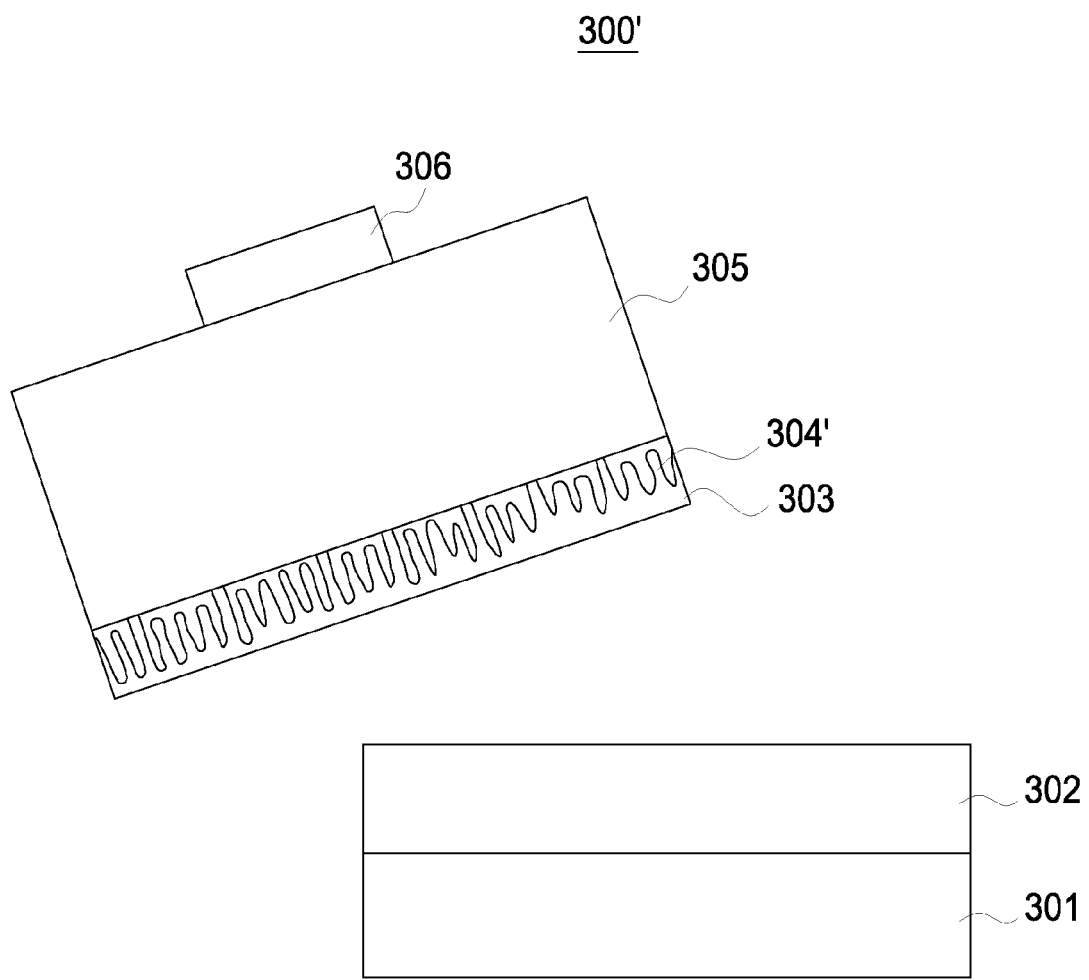

In one embodiment, as FIG. 3F illustrates, the first transition layer 303 can be separated from the substrate 301 to form another optoelectronic device 300'. In one embodiment, the optoelectronic device 300' can be used to bond to a submount (not shown) as a thin-film flip chip type device.

Figure 5A:
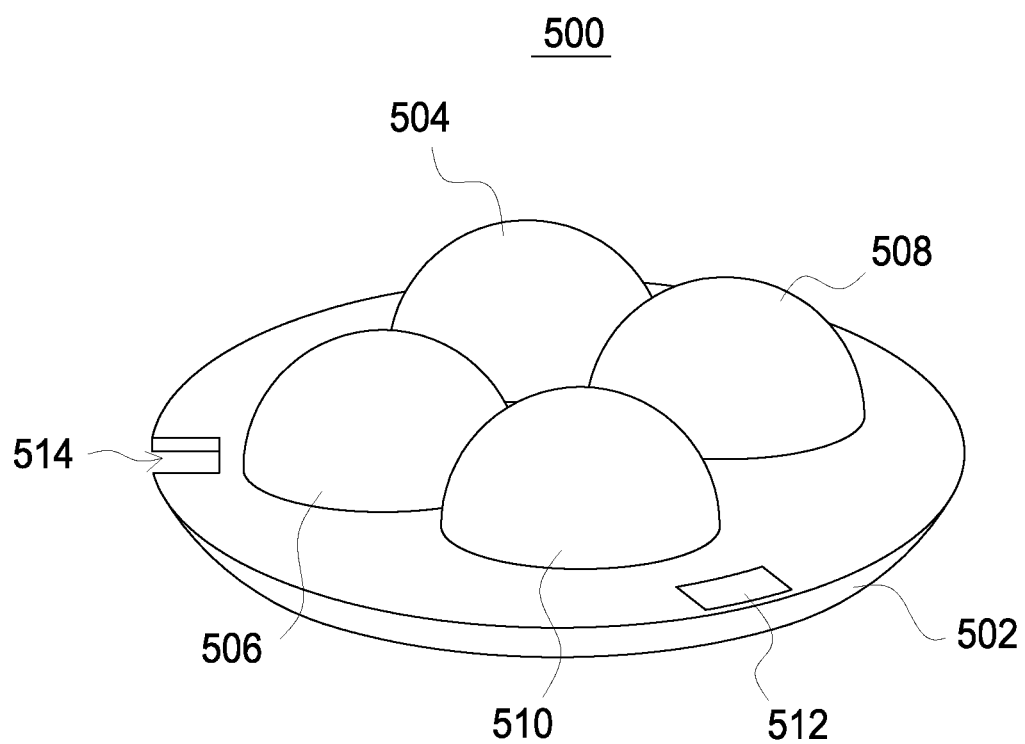
FIGS. 5A-5C illustrates an optoelectronic module of an embodiment in the present disclosure.
Figure 5B:
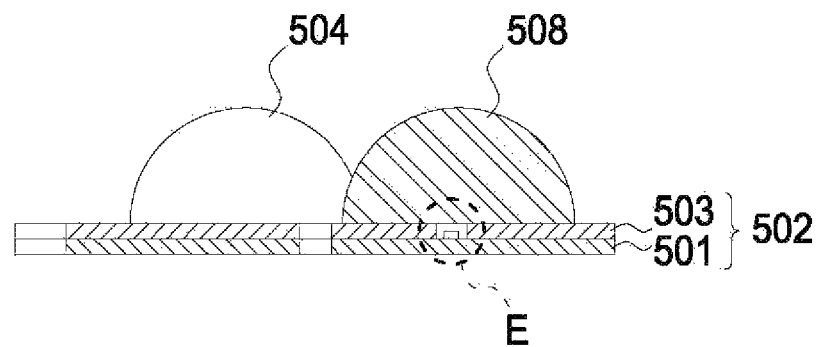
Figure 5C:
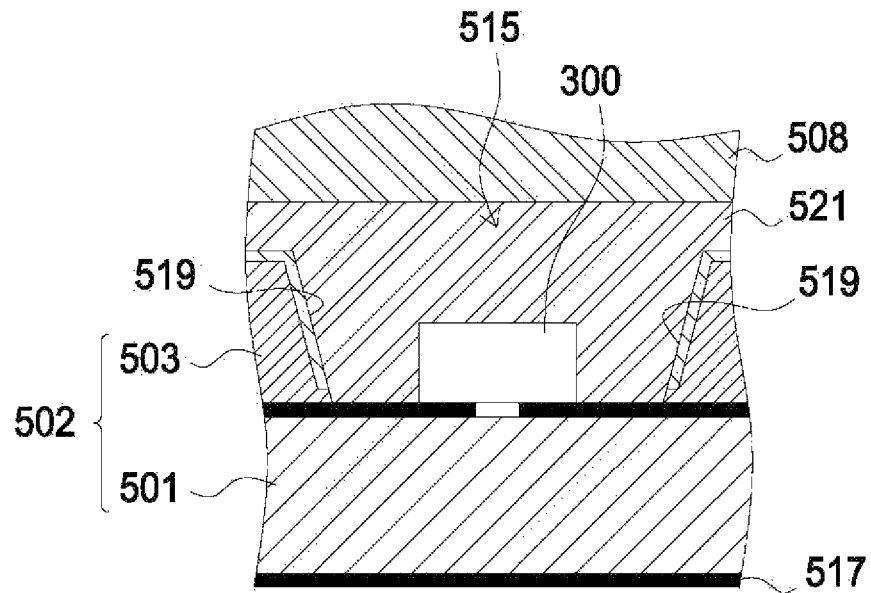

FIGS. 5A-5C illustrates an optoelectronic module of an application in the present disclosure. FIG. 5A is an external perspective view illustrating an optoelectronic module 500 including a submount 502, an optoelectronic device (not shown) described above, a plurality of lens 504, 506, 508, 510, and two power supply terminals 512, 514. The LED module 500 is attached to a lighting unit 540 which will be described in following paragraphs.

FIG. 5B is a plan view illustrating the optoelectronic device module 500, and FIG. 5C is an enlargement view illustrating a portion E shown in FIG. 5B. As FIG. 5B and 5C illustrates, the submount 502 including an upper subunit 503 and a lower subunit 501, and at least one surface of the lower subunit 501 is contacted with the upper subunit 503. The lens 504, 508 is formed on the upper subunit 503. At least one through hole 515 is formed on the upper subunit 503 and at least one of the optoelectronic devices 300 is formed inside the through hole 515 and contacted with the lower subunit 501. Besides, the optoelectronic device 300 is encapsulated by an adhesive agent 521 and a lens 508 is formed on the adhesive agent 521 wherein the material of the adhesive agent 521 may be a silicone resin, an epoxy resin or the like. In one embodiment, a reflecting layer 519 is formed on the sidewall of the through hole 515 to increase the light emitting efficiency. A metal layer 517 can be formed on the lower surface of the lower subunit 501 for improving heat dissipation.

Figure 6A:
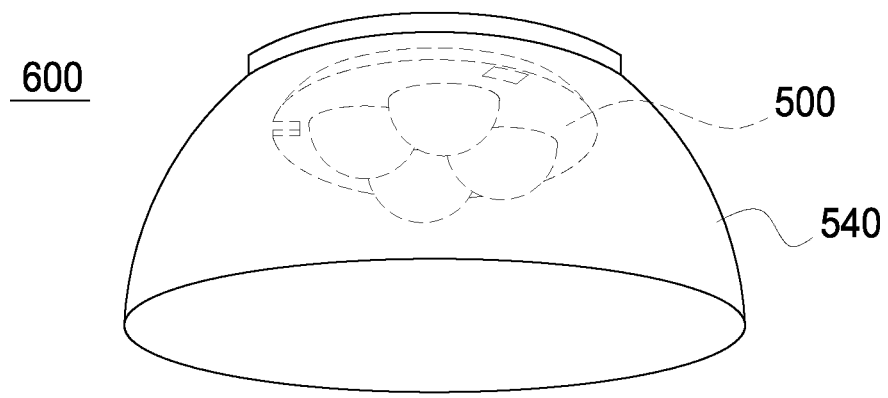
FIGS. 6A-6B illustrates a lighting apparatus of an embodiment in the present disclosure.
Figure 6B:
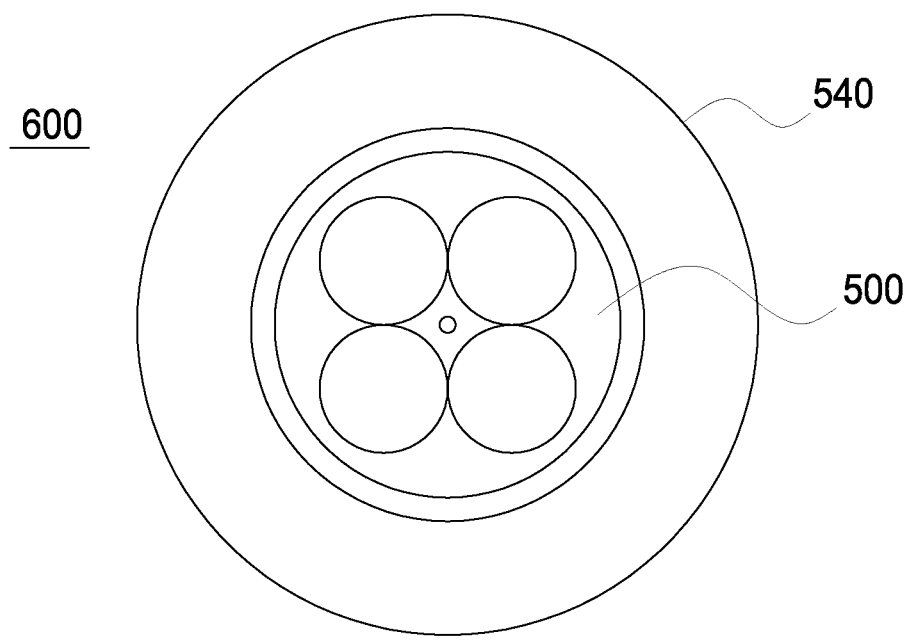

FIGS. 6A-6B illustrates a lighting apparatus of an embodiment in the present disclosure. The lighting apparatus 600 includes an optoelectronic module 500, a lighting unit 540, a power supply circuit (not shown) to supply current to the lighting apparatus 600 and a control unit (not shown) to control the power supply circuit. The lighting apparatus 600 can be an illumination device, such as street lamps, headlights or indoor illumination light source, and can be a traffic sign or a backlight module of the display panel.

Figure 7:
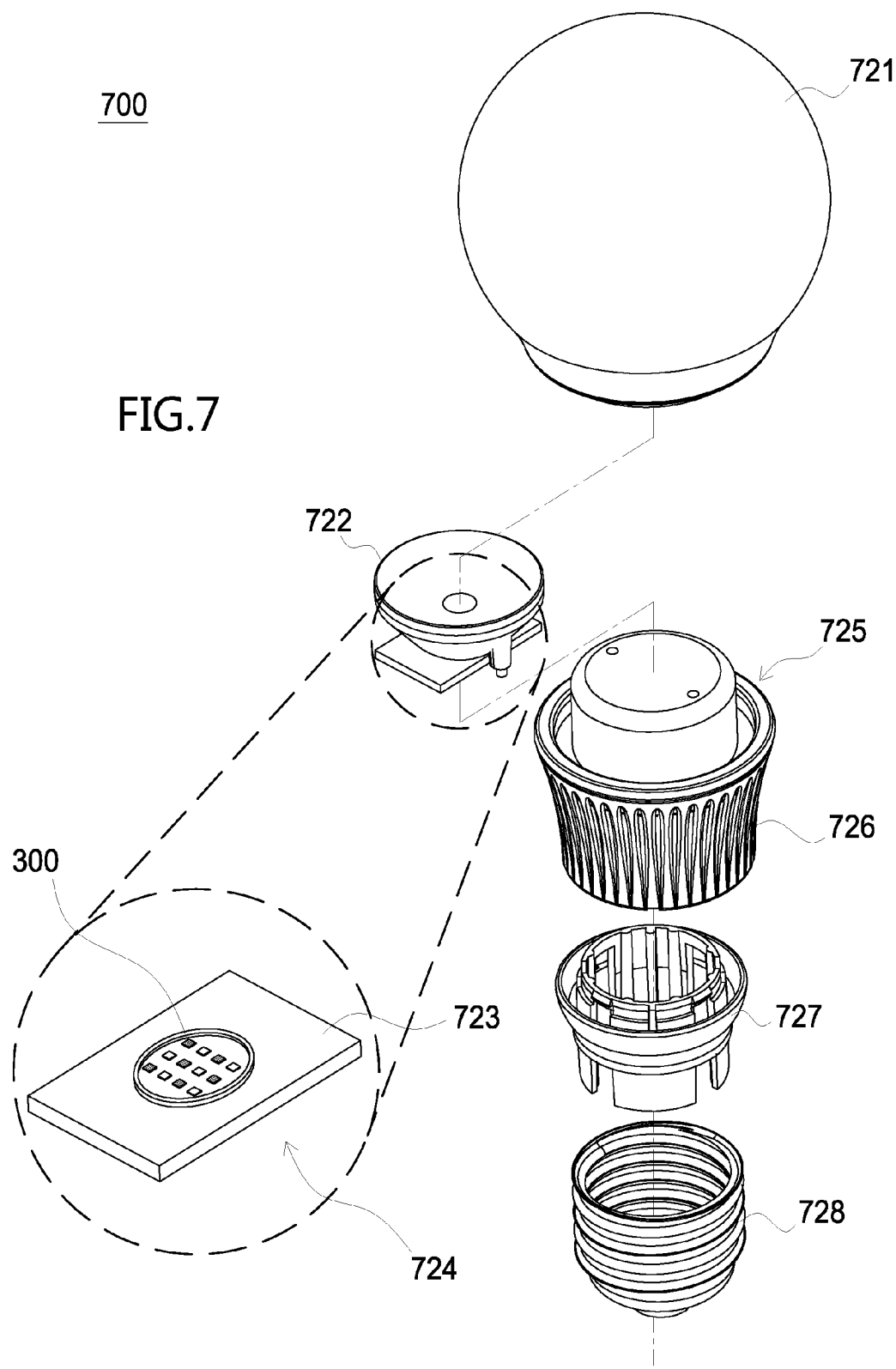
FIG. 7 is an explosive diagram of a bulb in accordance with an embodiment of the present application.

FIG. 7 illustrates an explosive diagram of a bulb in accordance with another application of the present application. The bulb 700 comprises a cover 721, a lens 722, a lighting module 724, a lamp holder 725, a heat sink 726, a connecting part 727, and an electrical connector 728. The lighting module 724 comprises a carrier 723 and a plurality of optoelectronic device 300 of any one of the above mentioned embodiments on the carrier 723.

Specifically, the optoelectronic device comprises light-emitting diode (LED), photodiode, photo resister, laser diode, infrared emitter, organic light-emitting diode and solar cell. The substrate 301 can be a growing or carrying base. The material of the substrate 301 comprises an electrically conductive substrate, electrically insulating substrate, transparent substrate, or opaque substrate. The material of the electrically conductive substrate can be GaAs, metal such as Ge, oxide such as $LiAlO_2$ and ZnO, nitrogen compound such as GaN and AlN, phosphide such as InP, silicon compound such as SiC, or Si. The material of the transparent substrate can be chosen from sapphire ($Al_2O_3$), LiAlO$_2$, ZnO, GaN, AlN, glass, diamond, CVD diamond, diamond-like carbon (DLC), spinel (MgAl$_2$O$_3$), SiO$_x$, or LiGaO$_2$.

The first semiconductor layer 3051 and the second semiconductor layer 3053 are different in electricity, polarity or dopant, or are the different semiconductor materials used for providing electrons and holes, wherein the semiconductor material can be single semiconductor material layer or multiple semiconductor material layers. The polarity can be chosen from any two of p-type, n-type and i-type. The active layer 3052 is disposed between the first semiconductor layer 3051 and the second semiconductor layer 3052 respectively where the electrical energy and the light energy can be converted or stimulated converted. The devices which can convert or stimulated convert the electrical energy into the light energy are like light-emitting diode, liquid crystal display, and organic light-emitting diode. The devices which can convert or stimulated convert the light energy into the electrical energy are like solar cell and optoelectronic diode. The material of the first semiconductor layer 3051 the active layer 3052 and the second semiconductor layer 3053 comprises Ga, Al, In, As, P, N, Si, and the combination thereof.

The optoelectronic device of another embodiment in the application is an epitaxial device or a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can contain elements selected from Al, Ga, In, P, N, Zn, O, or the combination thereof. The structure of the active layer 3052 can be single heterostructure (SH), double heterostructure (DH), double-side double heterostructure (DDH) or multi-quantum well (MQW), wherein the wavelength of the light emitted from the active layer 3052 can be changed by adjusting the number of the pairs of MQW.

In one embodiment of the application, a buffer layer (not shown) can be selectively disposed between the first semiconductor layer 3051 and the substrate 301. The buffer layer is between the two material systems to transit the material system of the substrate 301 to the material system of the first semiconductor layer 3051. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be selected from organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be MN or GaN, and the buffer layer can be formed by sputtering or atomic layer deposition (ALD).

A contacting layer (not shown) can be selectively formed on the second semiconductor layer 3053. The contacting layer is disposed on the side of the second semiconductor layer 3053 away from the active layer 3052. Specifically, the contacting layer can be optical layer, electrical layer, or the combination thereof. The optical layer can change the radiation or the light from or entering the active layer 3052 wherein the optical layer can change but not limited to the frequency, the wavelength, the intensity, the flux, the efficiency, the color temperature, rendering index, light field, angle of view. The electrical layer can change the value, density, and distribution of voltage, resistor, current and capacitance of any two relative sides of the contacting layer. The material of the contacting layer comprises oxide such as conductive oxide, transparent oxide and the oxide with the transparency over 50%, metal such as transparent metal and the metal with transparency over 50%, organic material, inorganic material, fluoresce material, ceramic, semiconductor material and doping semiconductor material. In some applications, the material of the contacting layer can be selected from InTiO, CdSnO, SbSnO, InZnO, ZnAlO or ZnSnO. If the material of the contacting layer is transparent metal, the thickness of the contacting layer is in a range of 0.005 μm~0.6 μm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method of fabricating an epitaxial device, comprising:
   providing a substrate having a first surface and a normal direction;
   epitaxially forming a first transition layer in a first temperature on the first surface of the substrate and in-situ incorporating a porogen into the first transition layer;
   adjusting the first temperature to a second temperature to burn out the porogen from the first transition layer;
   providing an epitaxial layer on the first transition layer; and
   removing the substrate from the epitaxial layer, wherein a hollow component is formed inside the first transition layer after burning out the porogen, wherein the porogen is a cyclic structure.

2. The method of fabricating an epitaxial device of claim 1, wherein the first temperature is lower than the second temperature.

3. The method of fabricating an epitaxial device of claim 1, wherein the second temperature is 700-900° C.

4. The method of fabricating an epitaxial device of claim 1, further comprising forming a second transition layer on the first transition layer.

5. The method of fabricating an epitaxial device of claim 1, wherein the hollow component can be a nano-scale structure and/or an elongated structure having an elongated direction parallel to the normal direction.

6. The method of fabricating an epitaxial device of claim 1, wherein a plurality hollow component is formed inside the first transition layer and at least two hollow components that can link into a mesh or porous structure and the porosity of the hollow component can be 5-50%.

7. The method of fabricating an epitaxial device of claim 4, wherein the epitaxial stack comprising a first conductivity semiconductor layer, an active layer and a second conductivity semiconductor layer formed on the first transition layer and wherein the material of the first conductivity semiconductor layer, the active layer, or the second conductivity semiconductor layer contains at least one element selected from the group consisting of Al, Ga, In, As, P, and N.

8. The method of fabricating an epitaxial device of claim 1, further comprising forming an inter layer between the first transition layer and the substrate.

9. The method of fabricating an epitaxial device of claim 8, wherein the inter layer is an unintentional doped layer or an undoped layer.

10. The method of fabricating an epitaxial device of claim 8, wherein the inter layer is non-single crystalline or single crystalline.

11. The method of fabricating an epitaxial device of claim 1, wherein the porogen is Bi-Cyclic Tetramethyl Gallium Nitride or Tri-Cyclic Pentamethyl Gallium Nitride.

12. The method of fabricating an epitaxial device of claim 1, wherein the first transition layer having a first surface and a second surface opposite to the first surface and the second surface is closer to the substrate, and the hollow component inside the first transition layer having an opening on the first surface of the first transition layer.

13. The method of fabricating an epitaxial device of claim 1, further comprising a step of separating the substrate and the first transition layer.

14. The method of fabricating an epitaxial device of claim 1, wherein in the step of in-situ incorporating a porogen into the first transition layer the porogen is buried in the first transition layer.

\* \* \* \* \*